United States Patent [19]

Schulte et al.

[11] Patent Number: 4,865,245

[45] Date of Patent: Sep. 12, 1989

[54] OXIDE REMOVAL FROM METALLIC CONTACT BUMPS FORMED ON SEMICONDUCTOR DEVICES TO IMPROVE HYBRIDIZATION COLD-WELDS

[75] Inventors: Eric F. Schulte, Santa Barbara; Eric D. Olson, Lompoc, both of Calif.

[73] Assignee: Santa Barbara Research Center, Goleta, Calif.

[21] Appl. No.: 100,683

[22] Filed: Sep. 24, 1987

[51] Int. Cl.[4] ........................ B23K 20/14; B23K 20/24
[52] U.S. Cl. .................................... 228/116; 228/205; 228/180.2
[58] Field of Search ............... 228/115, 116, 206, 207, 228/180.2, 214

[56] References Cited

U.S. PATENT DOCUMENTS

| | | | |
|---|---|---|---|
| 4,245,768 | 1/1981 | Sater | 228/116 |
| 4,379,218 | 4/1983 | Grebe et al. | 228/205 X |
| 4,573,627 | 3/1986 | Miller et al. | 228/180.2 X |

*Primary Examiner*—Nicholas P. Godici
*Assistant Examiner*—Carmine Cuda
*Attorney, Agent, or Firm*—M. J. Meltzer; W. C. Schubert

[57] ABSTRACT

A method is disclosed for joining two semiconductor devices 10 and 10', each having a plurality of metallic contact bumps 12 and 12' on the major surfaces 14 and 14' thereof. The devices are etched to remove oxide 18 from the contact bumps and to prevent subsequent oxidation thereon. The devices are then oriented so that the bumps 12 and 12' on the respective devices are aligned opposite each other. By applying pressure to the devices, the bumps are caused to cold-weld together to form a single device 24.

19 Claims, 1 Drawing Sheet

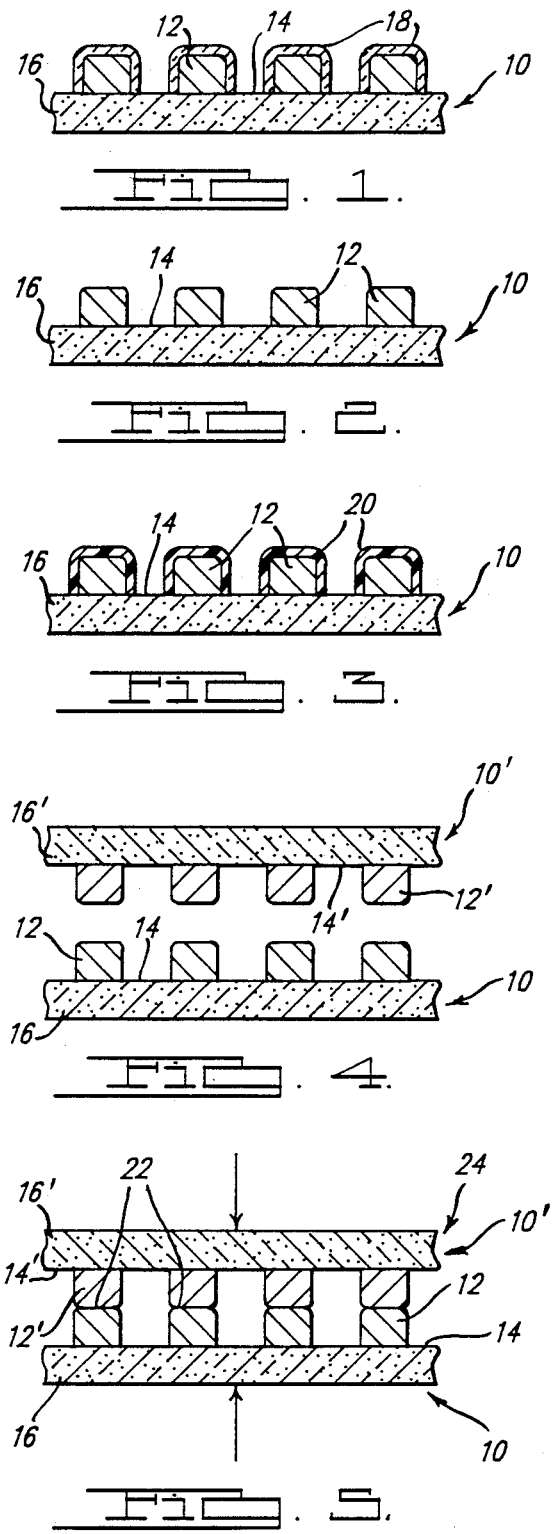

OXIDE REMOVAL FROM METALLIC CONTACT BUMPS FORMED ON SEMICONDUCTOR DEVICES TO IMPROVE HYBRIDIZATION COLD-WELDS

BACKGROUND OF THE INVENTION

1. Technical Field

This invention relates to the hybridization of semiconductor devices. More particularly, it relates to a method of etching metallic contact bumps formed on component devices to remove oxide from the bumps thereby improving the reliability of the hybridized device.

2. Discussion

Recent advances in semiconductor device technology have seen the increased need to join (also referred to herein as "hybridize") two or more semiconductor component devices to each other to form a single hybridized device. To achieve high performance characteristics in hybridized devices, production methods require the ability to easily cold-weld together the metallic contact bumps of the hybridized device's individual component devices. The term "cold-welding" is known and refers to a method of joining materials together by welding them absent the application of high-temperatures. By eliminating the need for high welding temperatures, cold-welding naturally decreases thermal damage to component devices, which potentially leads to improved device performance.

Unfortunately, until the present invention, it has been difficult to reliably cold-weld semiconductor devices by applying lower weld pressures. In particular, it has been found that lower weld pressures often fail to overcome the presence of a weld-inhibiting oxide layer on the weld interface of the metallic contact bumps.

In recent years, the conventional approach to welding two component devices, each having a plurality of metallic contact bumps formed thereon, has been to apply a relatively high pressure to break the weld-inhibiting oxide layer and force the contact bumps of the two devices to weld to each other. That method is commonly employed with devices having indium bumps as the metallic contact bumps. Indium is known for its ability to form good cold-welds with itself.

Unfortunately, that technique has several drawbacks. In particular, a thin, tough oxide layer readily forms on the surface of the indium bumps. The oxide layer tends to prevent good welds at lower pressures because of excessive pressures required to break the layer so as to expose the bare indium necessary to weld. The application of excessive pressures, however, often damages the sensitive semiconductor component devices underlying the contact bumps. Additionally, application of excessive pressures has caused the bumps to deform plastically in compression, thereby reducing the bump height. As a consequence of the above problems, the reliability of the hybridized device is degraded such as by an increase in resistance at the bump interface and in some instances, the occurrence of premature physical separation of the component devices.

The application to oxidized metal of a flux compound containing deoxidizers to remove oxide layers prior to welding is known. Similarly it is known that in some non-hybridizing applications, flux is applied to indium to remove oxide formed thereon. However, the literature does not provide a teaching as to how to overcome one or more of the problems discussed above.

SUMMARY OF THE INVENTION

Pursuant to the present invention, a method is disclosed for joining two semiconductor devices, each having a plurality of metallic contact bumps on the major surfaces thereof. The method includes the steps of etching the devices to remove oxide from the bumps. The etched devices are then oriented so that the bumps on the respective devices are aligned opposite each other. Pressure is then applied to the devices to cause the bumps to join together.

Among the advantages of the present invention is that more reliable cold-welds can be achieved at relatively low weld pressures. This provides a very important commercial advantage since more reliable cold-welds formed at lower weld pressures increase production yield and improve performance characteristics of hybridized devices.

BRIEF DESCRIPTION OF THE DRAWINGS

The various advantages of the present invention will become apparent to one skilled in the art by reading the following specification and by reference to the drawings in which:

FIGS. 1–5 are cross-sectional views of semiconductor devices having a plurality of metallic contact bumps formed on the major surfaces thereof, during various steps in the joining process; and FIG. 6 is a flow chart illustrating the preferred steps to carry out the method of the present invention.

DESCRIPTION OF THE PREFERRED EMBODIMENTS

For ease of description, the method of this invention will be described in connection with the hybridization of but one combination of component semiconductor devices. However, it should be realized that other semiconductor devices having metallic contact bumps formed thereon can be hybridized according to the steps of this process. As represented in step 1 of FIG. 6 and referring to FIG. 1, the first general step is to form a semiconductor component device 10 having a plurality of metallic contact bumps 12 on the major surface 14 of the substrate 16. It is preferred that the contact bumps 12 are indium contact bumps. It is known that the indium bumps 12 will oxidize to form a thin, tough oxide layer 18. In a preferred application of this invention, component device 10 is a mercury-cadmium-tellurium photodetector array that is desired to be welded to an indium-antimony photodetector array. Other component devices can be hybridized using this process including silicon photodetector arrays welded to silicon integrated circuit chips.

Referring now to FIG. 2 as represented in step 2 of FIG. 6, the thin, tough oxide layer 18 is removed by etching the indium contact bumps 12. To assure adequate removal of the oxide layer 18, a semiconductor component device 10 is placed in a chamber which is capable of evacuation to remove oxygen present therein. Once contained in the evacuation chamber, the chamber is evacuated to a pressure of approximately $10^{-7}$ torr. Once evacuated, a first reactive gas, suitable for etching, is introduced into the chamber where it remains therein for a predetermined length of time to remove the oxide layer 18 formed on the indium contact bumps 12. Upon completion of etching, the chamber is again evacuated to a pressure of about $10^{-7}$ torr to remove therefrom the first reactive etchant gas.

As represented in step 2 of FIG. 6 and referring to FIG. 3, a protective layer 20 is then deposited on the surface of the etched indium contact bumps 12. This is achieved by introducing into the evacuated chamber a plasma which contains suitable material to form a protective coating layer 20 on the indium bumps 12. The protective layer 20 should prevent oxidation from occurring prior to cold-welding the indium bumps. Upon deposition of the protective coating layer 20, the chamber is then back-filled with a non-reactive gas such as argon.

The chamber is then opened to the atmosphere and the semiconductor component device 10 is removed from the chamber. Because of the presence of a protective coating layer 20, the semiconductor device 10 either can be transferred to a storage facility, or immediately prepared for cold-welding, with a relatively low risk that the coated indium bumps will oxidize.

Just prior to welding, two similarly prepared component devices 10 and 10' are transferred to a second chamber capable of being evacuated, which is also part of a mating/aligning fixture. The two devices are placed on separate platforms contained in the chamber. The platforms are equipped with manipulators to control the horizontal and vertical directions of the devices resting thereon, as well as the angle of incline, so as to allow for precise alignment of the respective indium contact bumps 12 and 12' on the component devices 10 and 10', respectively.

The devices are then aligned as shown in FIG. 4 and as represented in step 4 of FIG. 6, so that indium bumps 12 and 12' which are disposed respectively on the major surfaces 14 and 14' of the substrates 16 and 16' of the respective devices 10 and 10' oppose each other. The protective layer 20 is then removed. To accomplish the protective layer's removal, the chamber in the mating-/aligning fixture containing the respective semiconductor devices is first evacuated to a pressure of about $10^{-7}$ torr. A second reactive gas is introduced into the chamber which volatilizes the protective coating 20 on the indium bumps 12 thereby facilitating the coating's removal.

As represented in step 5 of FIG. 6 and FIG. 5, the aligned devices having their indium bumps exposed, are then hybridized by applying to the devices a pressure of approximately 50 pounds per square inch. The pressure is applied while the devices are still in the chamber, and the pressure is sufficient to cause the indium contact bumps 12 of the two devices to weld together while maintained at substantially room temperature.

Because virtually no oxide layer 18 is present during this step, an increased surface area on the weld interface 22 of the indium contact bumps will be free to weld. This will effectively increase the subsequent tensile strength of the weld, and will also allow the weld to be carried on at reduced weld pressures because it is no longer necessary to apply additional pressure to break the tough oxide layer 18 on the indium bump surface to cause it to weld. Pursuant to this invention, weld pressures can be reduced to as low as one quarter of what is necessary under prior cold-welding practices.

Upon forming a single hybridized device 24, pressure is relieved from the two devices, and the hybridized device 24 is removed from the chamber of the mating-/aligning fixture. The hybridized device 24 is then mounted and wire-bonded to a chip carrier to form a finished product.

While it is preferred that the etching process is carried out using gaseous methods, it should be recognized that an alternative method of etching the oxide layer employs etching by wet chemical processing steps. Under this alternative method, indium contact bumps are first rinsed in a solvent to remove organic contaminants therefrom. It is preferred that the contact bumps are consecutively rinsed for approximately ten seconds in each of the individual solvents toluene, acetone, methanol, and isopropanol.

Upon removal of the organic contaminants, the devices are immersed in an etchant solution to remove the existing oxide layer from the indium contact bumps. The preferred etchant is a solution of 0.1 volume percent hydrochloric acid diluted in ethylene glycol, maintained at a temperature of about 27° C.

The devices remain immersed for approximately five minutes, a time which is predetermined to remove the oxide layer, and thereby expose the surface of the indium contact bump.

While the indium bumps are still wet from the etchant, the devices having the bumps thereon are then transferred to a mating/aligning fixture used for hybridization. It is desired to keep the indium bumps wet with etchant throughout the process so as to prevent the subsequent formation of oxide during the step of welding the devices together. The indium bumps are then oriented in the mating/aligning fixture so as to align the indium bumps of the respective surfaces.

Upon aligning the devices, a pressure of about 50 pounds per square inch is applied to cause the devices, which are still wet with etchant, to cold-weld together at their indium contact bumps and form a single hybridized device. After forming the cold-weld, the pressure is relieved.

The hybridized device is then removed from the mating/aligning fixture. The device is cleaned to remove substantially all of the remaining etchant by wicking a cleaning solution, preferably one containing methanol, through the hybrid gap for about thirty minutes. To evaporate the remaining solution, the devices are then placed, for approximately fifteen minutes, into an oven that is maintained at a temperature of about 60° C. The devices are then attached and wire bonded to a chip carrier to complete the finished product.

Devices made according to the present invention exhibit improved tensile rupture strengths due to increased area available to weld at the interface of the welded devices. Because it is unnecessary to break the tough oxide layer to expose the indium layer to form a weld, this process does not require excessive weld pressures. Consequently, indium bumps welded according to the present invention exhibit improved reliability and increased performance characteristics.

It should be understood, while this invention has been described in connection with one presently preferred example, that other modifications will be apparent to those skilled in the art after a study of the specification, drawings and following claims.

What is claimed is:

1. A method of joining two semiconductor devices, each having a plurality of metallic contact bumps on major surfaces thereof, said method comprising the steps of:
    (a) etching the devices to remove oxide from the bumps;

(b) orienting the devices so that the bumps on the respective devices are aligned opposite each other; and (c) cold-welding the devices by applying pressure to the devices to cause the bumps to join together to form a single device, whereby the resulting joint has relatively good tensile properties at lower joining pressures.

2. The method of claim wherein step (a) comprises:
(1) etching the devices with an etchant gas to remove oxide from the metallic contact bumps;
(2) depositing a protective layer on the contact bumps to prevent subsequent oxidation;
(3) removing the protective layer prior to welding the contact bumps.

3. The method of claim 1 wherein the devices are etched in an etchant solution.

4. The method of claim 3 wherein the etchant solution remains on the devices throughout the steps of orienting the devices and applying pressure to cause the devices to join together.

5. The method of claim 1 wherein the metallic contact bumps are indium contact bumps.

6. A method of cold-welding two semiconductor devices, each having a plurality of metallic contact bumps on major surfaces thereof, said method comprising the steps of:
(a) etching the devices to remove oxide from the area to be welded;
(b) transferring the devices to a mating/aligning fixture;
(c) aligning the contact bumps of the two devices in the mating/aligning fixture;
(d) applying pressure to the devices to cause the bumps to cold-weld together and form a single welded device; and
(e) relieving the pressure on the cold-welded device, and whereby the resulting weld has relatively good tensile properties at lower welding pressures.

7. The method of claim 6 wherein step (a) comprises:
(1) etching the device with an etchant gas to remove oxide from the metallic contact bumps;
(2) depositing a protective layer on the contact bumps to prevent subsequent oxidation.

8. The method of claim 7 wherein step (c) further comprises the step of removing the protective layer from the contact bumps.

9. The method of claim 6 wherein the devices are etched in an etchant solution.

10. The method of claim 9 wherein the etchant solution remains on the device throughout at least steps (a), (b), (c) and (d).

11. The method of claim 6 wherein the metallic contact bumps are indium contact bumps.

12. The method of claim 6 wherein the two semiconductor devices are a mercury-cadmium-tellurium photodetector array and an indium-antimony photodetector array.

13. A method of cold-welding two semiconductor devices each having a plurality of indium contact bumps on the major surfaces thereof, said method comprising the steps of:
(a) placing the semiconductor devices with indium bumps formed thereon in a first chamber capable of evacuation;
(b) evacuating the first chamber to remove oxygen therein;
(c) introducing into the first chamber a first reactive etchant gas;
(d) etching the indium bumps with the gas to remove oxide that may have formed thereon;
(e) evacuating the chamber to remove the first reacting etchant gas;
(f) introducing into the chamber a plasma that contains material that will form a protective layer on the indium bumps to prevent subsequent oxidation;
(g) depositing said material to form a protective layer on the indium bumps;
(h) transferring the devices to a second chamber in a mating/aligning fixture;
(i) aligning the indium bumps of the respective devices in the mating/aligning fixture;
(j) evacuating the second chamber;
(k) introducing a second reactive gas into the chamber that will volatilize the protecting coating on the indium bumps to remove the protective layer; and
(l) applying pressure to the devices while in the chamber to cause the indium contact bumps to weld together to form a single hybridized device.

14. The method of claim 13 wherein the two semiconductor devices are a mercury-cadmium-tellurium photodetector array and an indium-antimony photodetector array.

15. A method of welding two semiconductor devices each having a plurality of indium contact bumps on major surfaces thereof, said method comprising the steps of:
(a) rinsing the indium contact bumps on the devices in a solvent to remove organic contaminants;
(b) immersing the devices in an etchant solution to remove oxide from the indium contact bumps;
(c) transferring the devices to a mating/aligning fixture while the indium bumps are still wet from the etchant;
(d) aligning the indium bumps of the respective devices in the mating/aligning fixture while the indium bumps are still wet from the etchant; and
(e) applying pressure to the devices to cause them to weld together at their indium contact bumps to form a single hybrid device while the devices are still wet from the etchant.

16. The method of claim 15 wherein the two semiconductor devices are a mercury-cadmium-tellurium photodetector array and an indium-antimony photodetector array.

17. The method of claim 15 wherein the etchant solution is composed of 0.1% volume percent hydrochloric acid in ethylene glycol.

18. The method of claim 19 wherein step (e) comprises:
(1) immersing the hybridized device in a solution containing methanol to remove substantially all of the remaining etchant;
(2) removing the hybridized device from the solution;
(3) evaporating substantially all of the remaining solution.

19. The method of claim 16 which further comprises removing the remaining etchant from the hybrid device.

* * * * *